(12) United States Patent
Oda et al.

(10) Patent No.: US 10,547,301 B1
(45) Date of Patent: Jan. 28, 2020

(54) INVERTER DRIVER

(71) Applicant: Mitsubishi Electric Corporation, Tokyo (JP)

(72) Inventors: Hisashi Oda, Tokyo (JP); Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/440,494

(22) Filed: Jun. 13, 2019

(30) Foreign Application Priority Data

Oct. 19, 2018 (JP) .................................. 2018-197341

(51) Int. Cl.
*H03K 17/687* (2006.01)
*H03K 17/082* (2006.01)
*H02M 7/48* (2007.01)
*H02M 1/08* (2006.01)

(52) U.S. Cl.
CPC ............ *H03K 17/082* (2013.01); *H02M 1/08* (2013.01); *H02M 7/48* (2013.01)

(58) Field of Classification Search
CPC ....... H03K 17/04126; H03K 17/04123; H03K 17/063; H03K 17/082; H03K 17/0822; H03K 17/567; H03K 19/00361; H04L 25/028; H04L 25/0272; H02M 1/08; H02M 7/48
See application file for complete search history.

(56) References Cited

U.S. PATENT DOCUMENTS

| 6,057,728 A | * | 5/2000 | Igarashi | ............. | H03K 17/0828 |
| | | | | | 327/546 |
| 2012/0153719 A1 | * | 6/2012 | Inaba | .................. | H03K 17/0828 |
| | | | | | 327/109 |

FOREIGN PATENT DOCUMENTS

| JP | 2001-197723 A | 7/2001 |
| JP | 2017-063392 A | 3/2017 |
| JP | 2017-212870 A | 11/2017 |

* cited by examiner

*Primary Examiner* — Long Nguyen
(74) *Attorney, Agent, or Firm* — Studebaker & Brackett PC

(57) ABSTRACT

An inverter driver includes: a switching device; a drive circuit driving the switching device; a current detection device generating a voltage signal corresponding to a current flowing through the switching device; a noise filter removing noise superposed on the voltage signal; an excess current detection circuit outputting an excess current detection signal when the voltage signal input via the noise filter exceeds a first threshold value; and a short circuit detection circuit outputting an error signal when the excess current detection signal is input or the voltage signal input by bypassing the noise filter exceeds a second threshold value.

7 Claims, 5 Drawing Sheets

INVERTER DRIVER

BACKGROUND OF THE INVENTION

Field

The present invention relates to an inverter driver driving a switching device.

Background

In an inverter driver, a voltage signal corresponding to a current flowing through a switching device is input into a current detection circuit. The current detection circuit includes a comparator configured to detect an excess current and a comparator configured to detect a short circuit (for example, refer to JP 2017-212870 A).

SUMMARY

When a switching device is driven at a high speed, noise is superposed on a voltage signal, causing a short circuit or an excess current to be erroneously detected from time to time. A risk of occurrence of an erroneous detection due to noise is increased as the switching device is driven at faster speeds. A voltage signal thus needs to be input into a current detection circuit via a noise filter. However, since using the noise filter generates a certain delay time in detection, a switching device having a low short circuit tolerance is thermally broken before a short circuit is detected and the switching device is protected. Consequently, the production costs are increased since the switching device needs to be designed to have a high short circuit tolerance.

The present invention has been made to solve the problem described above, and an object of the present invention is to obtain an inverter driver that can be produced at lower costs while maintaining its excess current detection accuracy.

An inverter driver according to the present invention includes: a switching device; a drive circuit driving the switching device; a current detection device generating a voltage signal corresponding to a current flowing through the switching device; a noise filter removing noise superposed on the voltage signal; an excess current detection circuit outputting an excess current detection signal when the voltage signal input via the noise filter exceeds a first threshold value; and a short circuit detection circuit outputting an error signal when the excess current detection signal is input or the voltage signal input by bypassing the noise filter exceeds a second threshold value.

In the present invention, the excess current detection circuit detects an excess current based on the voltage signal input via the noise filter, so that the detection accuracy of an excess current can be maintained. Consequently, even with an inverter driver specified with high-speed switching, a malfunction due to noise generated at the time of switching can be prevented. The short circuit detection circuit detects a short circuit and protects the switching device based on the voltage signal input by bypassing the noise filter. This enables the switching device to be stopped being driven quickly when a short circuit occurs. This enables in turn the short circuit tolerance of the switching device to be designed short, reducing the production costs.

Other and further objects, features and advantages of the invention will appear more fully from the following description.

DESCRIPTION OF EMBODIMENTS

An inverter driver according to the embodiments of the present invention will be described with reference to the drawings. The same components will be denoted by the same symbols, and the repeated description thereof may be omitted.

First Embodiment

Figure 1:
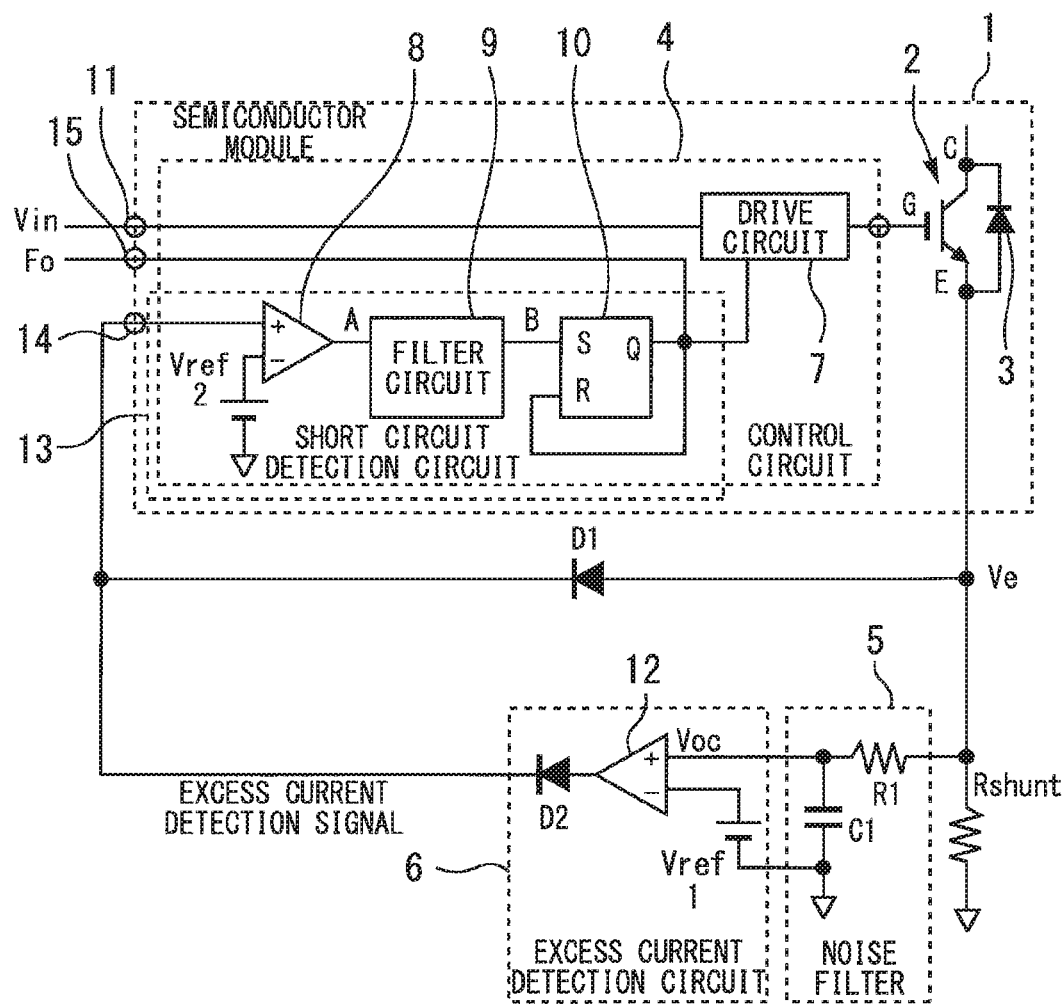
FIG. 1 is a diagram illustrating an inverter driver according to a first embodiment.

FIG. 1 is a diagram illustrating an inverter driver according to a first embodiment. A switching device 2, a free-wheel diode 3, and a control circuit 4 are provided in an interior of a semiconductor module 1. A shunt resistor Rshunt, a noise filter 5, an excess current detection circuit 6, and a diode D1 are provided in an exterior of the semiconductor module 1. The control circuit 4 includes a drive circuit 7, a comparator 8, a filter circuit 9, and an SR latch circuit 10.

The drive circuit 7 drives the switching device 2 according to an input voltage Vin input from an exterior into the semiconductor module 1 via a terminal 11. An IGBT is used as the switching device 2. The free-wheel diode 3 refluxes a current when the switching device 2 is off.

The shunt resistor Rshunt is connected between an emitter E of the switching device 2 and GND. The shunt resistor Rshunt constitutes a current detection device configured to generate a voltage signal Ve corresponding to a current flowing through the switching device 2. Note that another current detection device such as a Hall device, a current transformer or the like may be used as the current detection device in place of the shunt resistor Rshunt. Additionally, in the case of the switching device 2 including a current sense device, a current may be detected by causing a sense current to flow through a current detection resistor.

The noise filter 5 constitutes an RC filter including a resistor R1 and a capacitor C1. The noise filter 5 removes noise superposed on a voltage signal Ve.

The excess current detection circuit 6 includes a comparator 12 and a diode D2. An output voltage Voc of the noise filter 5 is input to a positive terminal of the comparator 12. A first threshold value Vref1 is input to a negative terminal of the comparator 12. A voltage output from the comparator 12 via the diode D2 constitutes an excess current detection signal. That is, the excess current detection circuit 6 determines that an excess current is generated and outputs an excess current detection signal when a voltage signal Voc input via the noise filter 5 exceeds the first threshold value Vref1.

A short circuit detection circuit 13 includes the comparator 8, the filter circuit 9 and the SR latch circuit 10. A voltage signal Ve is input to a positive terminal of the comparator 8 via the diode D1 and a terminal 14. An excess current detection signal is also input to the positive terminal of the comparator 8 via the terminal 14. A second threshold value Vref2 is input to a negative terminal of the comparator 8. The second threshold value Vref2 is set at a higher value than the first threshold value Vref1. Additionally, a voltage value of an excess current detection signal output from the excess current detection circuit 6 when an excess current is detected is greater than the second threshold value Vref2. An output voltage A of the comparator 8 is input to the filter circuit 9. An output voltage B of the filter circuit 9 is input to an S terminal of the SR latch circuit 10, and an error signal Fo is output from a Q terminal. Consequently, the short circuit detection circuit 13 outputs an error signal Fo when the excess current detection signal is input from the excess current detection circuit 6 or a voltage signal Ve input by bypassing the noise filter 5 exceeds the second threshold value Vref2. Note that an excess current detection signal can be input directly to the filter circuit 9 or the SR latch circuit 10 by bypassing the comparator 8. In this case, a terminal through which an excess current detection signal is input from the exterior to the interior of the semiconductor module 1 needs to be added.

An error signal Fo is input to an R terminal of the SR latch circuit 10 and the drive circuit 7 and is output to the exterior of the semiconductor module 1 via a terminal 15. Consequently, the inverter driver outputs an error signal Fo to the exterior of the semiconductor module 1 when an occurrence of an excess current or a short circuit is determined. The drive circuit 7 cuts off a gate signal Vg of the switching device 2 to stop driving the switching device 2 when an error signal Fo is input.

Figure 2:
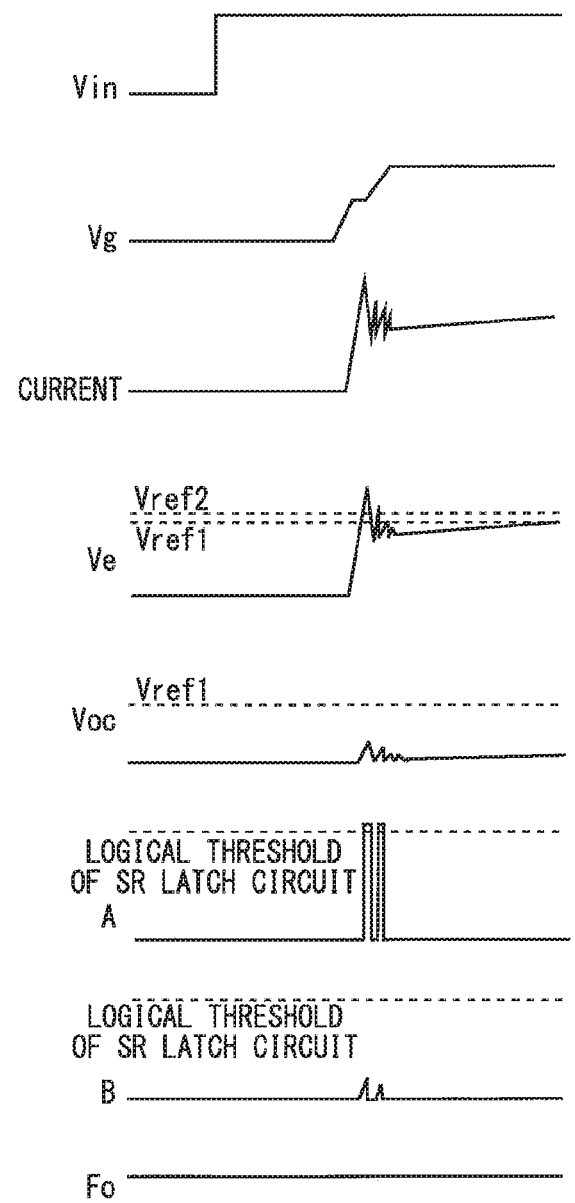
FIG. 2 is a diagram illustrating a sequence when the inverter driver according to the first embodiment operates normally.

FIG. 2 is a diagram illustrating a sequence when the inverter driver according to the first embodiment operates normally. When a control signal Vin is input and the switching device 2 is switched on, a current flows through the shunt resistor Rshunt to thereby generate a voltage signal Ve. Noise superposed on a voltage signal Ve generated immediately after a rise of a current becomes greater as the drive circuit 7 executes switching at faster speeds, which increases a risk of erroneously detecting a short circuit or an excess current. An output voltage Voc of the noise filter 5 is input to the comparator 12. Setting a time constant of the noise filter 5 according to noise generated can prevent an erroneous detection of an excess current.

The second threshold value Vref2 is set at a higher value than a peak value of noise. This can avoid an erroneous detection of a short circuit due to noise. Additionally, when switching is executed at higher speeds, noise having a high peak value and a short period may be generated. Then, a time period is set when an output voltage A of the comparator 8 is input to a filter circuit 9 of the next stage to negate a short circuit determination. This can avoid an erroneous detection of a short circuit due to the noise having a high peak value and a short period.

Figure 3:
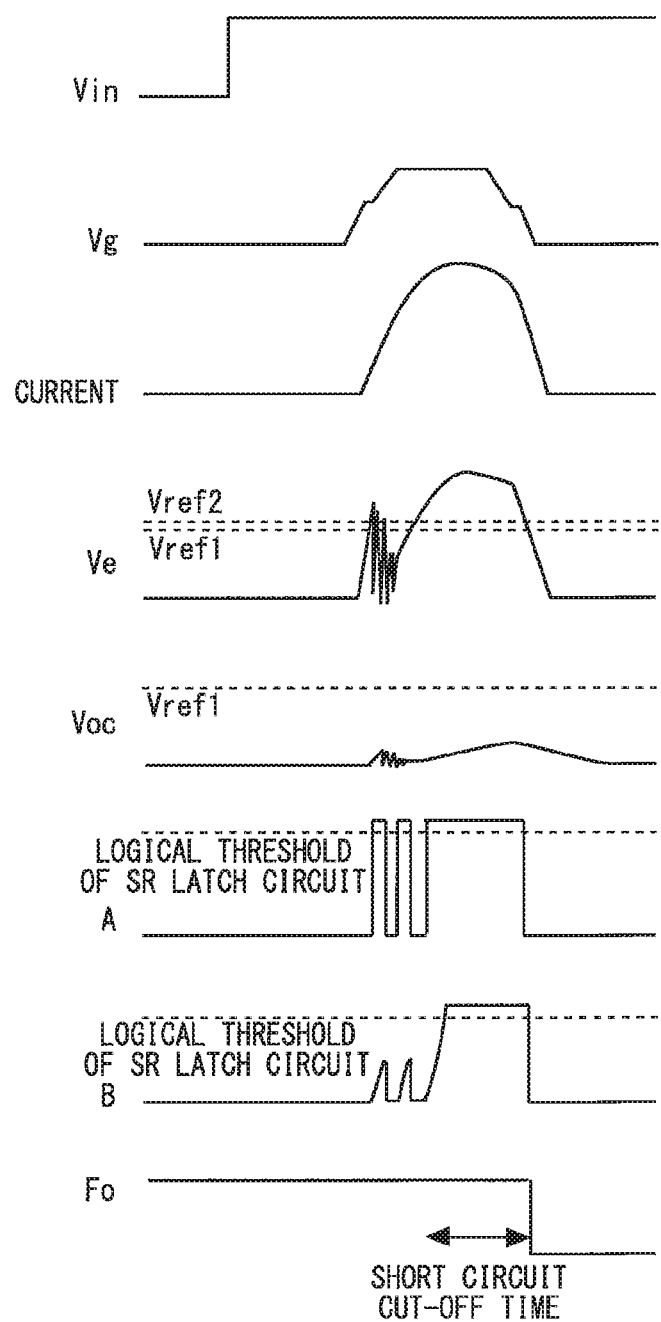
FIG. 3 is a diagram illustrating a sequence when the inverter driver according to the first embodiment operates while a short circuit is occurring.

FIG. 3 is a diagram illustrating a sequence when the inverter driver according to the first embodiment operates while a short circuit is occurring. Even when a great current flows through the switching device 2 as a result of a malfunction of the inverter driver, noise is generated in a voltage signal Ve immediately after a current flows as in the case with the normal operation. Thereafter, the voltage signal Ve increases in such a manner as to follow a current waveform. Since the response of the noise filter 5 is low, a time when the voltage signal Voc reaches the first threshold value Vref1 is delayed. On the other hand, since the short circuit detection circuit 13 detects a short circuit based on the voltage signal Ve input by bypassing the noise filter 5, the responsiveness of the short circuit detection circuit 13 is superior to that of the excess current detection circuit 6 and the short circuit detection circuit 13 can detect a short circuit quickly. Note that a short circuit cut-off time shown in the figure constitutes a time spent from when a short circuit is generated until the short circuit is detected to cut off the gate signal Vg of the switching device 2.

In this embodiment, the excess current detection circuit 6 detects an excess current based on the voltage signal input via the noise filter 5, so that the detection accuracy of an excess current can be maintained. Consequently, even with an inverter driver specified with high-speed switching, a malfunction due to noise generated at the time of switching can be prevented. The short circuit detection circuit 13 detects a short circuit and protects the switching device 2 based on the voltage signal Ve input by bypassing the noise filter 5. This enables the switching device 2 to be stopped being driven quickly when a short circuit occurs. This enables the short circuit tolerance of the switching device 2 to be designed short, reducing the production costs. Additionally, an on resistance of the switching device 2 can be reduced, which can also reduce the size of a chip. Due to the fact that in general, a short circuit current has a tendency that a great current flows, compared with an excess current, the second threshold value Vref2 for detecting a short circuit current needs to be set at a higher value than the first threshold value Vref1 for detecting an excess current.

Figure 4:
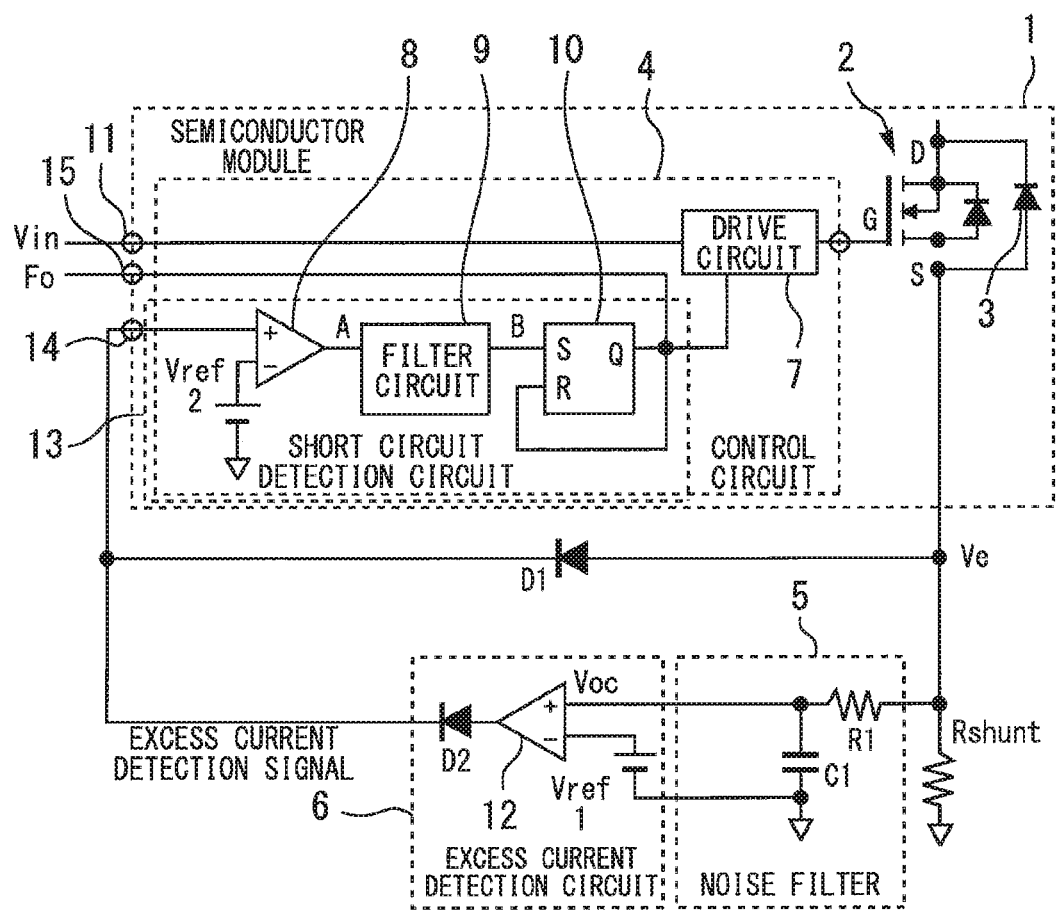
FIG. 4 is a diagram illustrating a modified example of the inverter driver according to the first embodiment.

FIG. 4 is a diagram illustrating a modified example of the inverter driver according to the first embodiment. In this modified example, a MOSFET is used as the switching device 2 in place of the IGBT. The MOSFET includes a parasitic diode, and this parasitic diode can be used as the free-wheel diode. Consequently, free-wheel diode 3 can be omitted.

Second Embodiment

Figure 5:
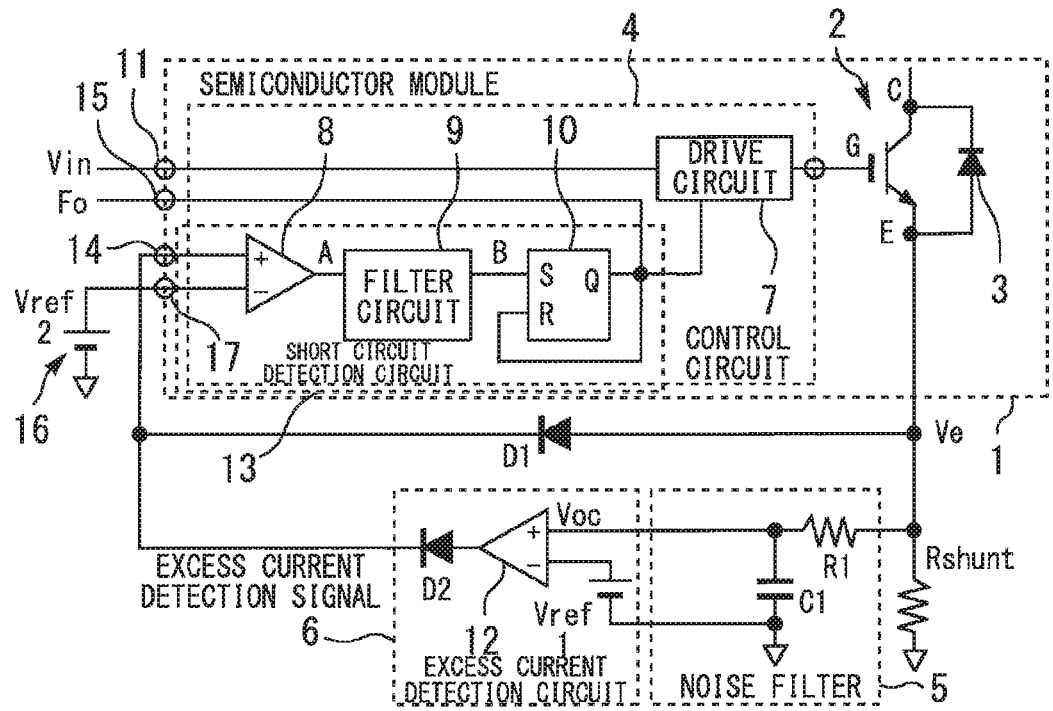
FIG. 5 is a diagram illustrating an inverter driver according to a second embodiment.

FIG. 5 is a diagram illustrating an inverter driver according to a second embodiment. A terminal 17 is provided by which a negative terminal of a comparator 8 provided in an interior of a semiconductor module 1 is connected with a setting circuit 16 provided in an exterior of the semiconductor module 1. A second threshold value Vref2 is set to match a peak value of noise generated at the time of switching in the exterior of the semiconductor module 1 by the setting circuit 16. This can reduce further an erroneous detection of a short circuit.

Third Embodiment

Figure 6:
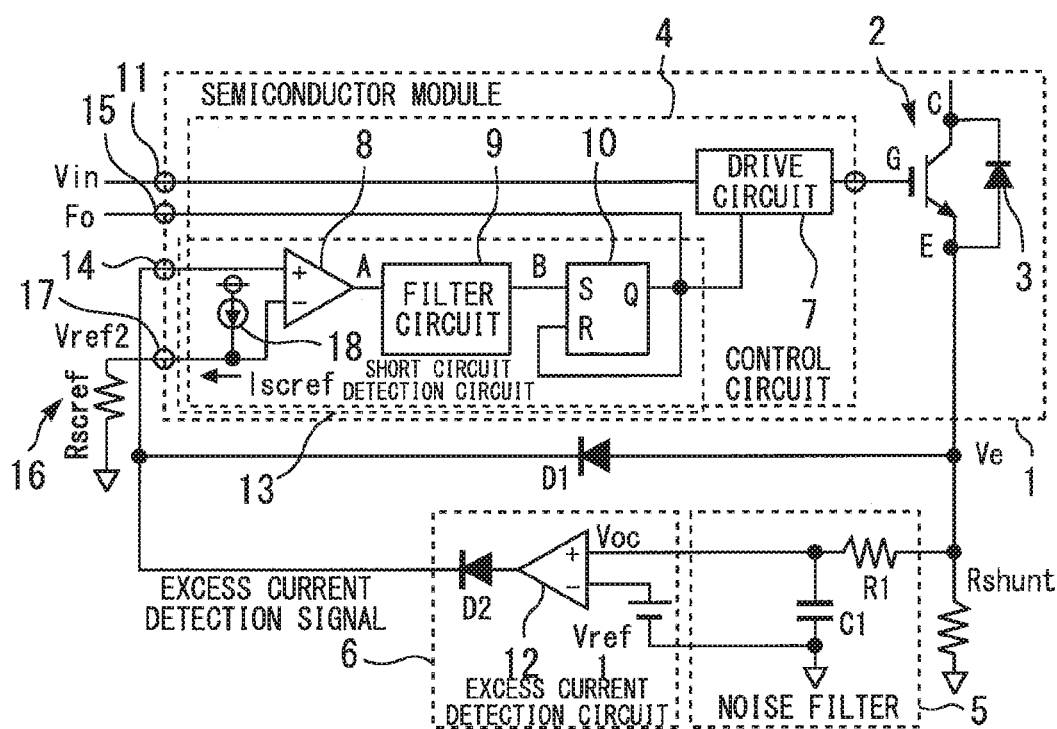
FIG. 6 is a diagram illustrating an inverter driver according to a third embodiment.

FIG. 6 is a diagram illustrating an inverter driver according to a third embodiment. A constant current circuit 18 is connected to a negative terminal of a comparator 8 and a terminal 17 in an interior of a semiconductor module 1. The constant current circuit 18 outputs a constant current Iscref. A resistor Rscref is connected between the terminal 17 and a GND in an exterior of the semiconductor module 1. A second threshold value Vref2 is set only based on a resistance value of the resistor Rscref in the exterior of the semiconductor module 1. This can reduce the size of the inverter driver in addition to the advantageous effect provided by the second embodiment.

The switching device 2 is not limited to a semiconductor device formed of silicon, but instead may be formed of a wide-bandgap semiconductor having a bandgap wider than that of silicon. The wide-bandgap semiconductor is, for example, a silicon carbide, a gallium-nitride-based material, or diamond. A switching device 2 formed of such a wide-bandgap semiconductor is capable of high-speed switching operation and has a high risk of false detection due to noise, so the configurations of the first to third embodiments are particularly effective. A switching device 2 formed of such a wide-bandgap semiconductor has a high voltage resistance and a high allowable current density, and thus can be miniaturized. The use of such a miniaturized switching device 2 enables the miniaturization and high integration of the inverter driver in which the switching device 2 is incorporated. Further, since the switching device 2 has a high heat resistance, a radiation fin of a heatsink can be miniaturized and a water-cooled part can be air-cooled, which leads to further miniaturization of the inverter driver. Further, since the switching device 2 has a low power loss and a high efficiency, a highly efficient inverter driver can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-197341, filed on Oct. 19, 2018 including specification, claims, drawings and summary, on which the Convention priority of the present application is based, is incorporated herein by reference in its entirety.

The invention claimed is:

1. An inverter driver comprising:
   a switching device;
   a drive circuit driving the switching device;
   a current detection device generating a voltage signal corresponding to a current flowing through the switching device;
   a noise filter removing noise superposed on the voltage signal;
   an excess current detection circuit outputting an excess current detection signal when the voltage signal input via the noise filter exceeds a first threshold value; and
   a short circuit detection circuit outputting an error signal when the excess current detection signal is input or the voltage signal input by bypassing the noise filter exceeds a second threshold value.

2. The inverter driver according to claim 1, wherein the second threshold value is set at a higher value than the first threshold value.

3. The inverter driver according to claim 2, wherein the second threshold value is set at a higher value than a peak value of the noise.

4. The inverter driver according to claim 1, wherein the drive circuit stops driving the switching device when the error signal is input.

5. The inverter driver according to claim 1, further comprising a setting circuit setting the second threshold value,
   wherein the switching device, the drive circuit, and the short circuit detection circuit are provided in an interior of a semiconductor module, and
   the setting circuit is provided in an exterior of the semiconductor module.

6. The inverter driver according to claim 5, wherein the setting circuit sets the second threshold value only based on a resistance value of a resistor in the exterior of the semiconductor module.

7. The inverter driver according to claim 1, wherein the switching device is made of a wide-band-gap semiconductor.

* * * * *